United States Patent
Mesh et al.

(10) Patent No.: US 6,233,262 B1
(45) Date of Patent: May 15, 2001

(54) DEVICE AND METHOD FOR MONITORING AND CONTROLLING LASER WAVELENGTH

(75) Inventors: Michael Mesh, Rehovot; Yossi Weiss, Pardesiya, both of (IL)

(73) Assignee: ECI Telecom Ltd., Petach Tikva (IL)

( * ) Notice: Subject to any disclaimer, the term of this patent is extended or adjusted under 35 U.S.C. 154(b) by 0 days.

(21) Appl. No.: 09/284,202

(22) PCT Filed: Aug. 10, 1998

(86) PCT No.: PCT/IL98/00370

§ 371 Date: Jun. 9, 1999

§ 102(e) Date: Jun. 9, 1999

(87) PCT Pub. No.: WO99/08349

PCT Pub. Date: Feb. 18, 1999

(30) Foreign Application Priority Data

Aug. 11, 1997 (IL) .......................................... 121509

(51) Int. Cl.[7] ....................................... H01S 3/13

(52) U.S. Cl. .......................................... 372/32; 372/38.02

(58) Field of Search .................................... 372/32, 38.01, 372/38.02; 280/205

(56) References Cited

U.S. PATENT DOCUMENTS 5,299,212  3/1994  Koch et al. ............................. 372/32

*Primary Examiner*—F. L. Evans
(74) *Attorney, Agent, or Firm*—Browdy And Neimark

(57) ABSTRACT

A device and method for monitoring and controlling the wavelength of a semiconductor laser having an adjustable wavelength, the device including a wavelength filter including a medium-dense wavelength division demultiplexer (WDM) arranged to receive a portion of the laser power of the laser and divide it between two filter outputs, a photoreceiver arranged to measure the output power at each filter output, a processor coupled to the photoreceivers and arranged to compute the ratio of power at the two filter outputs, apparatus to compare the computed ratio with a predetermined reference ratio, and apparatus to adjust the wavelength of the laser in response to the comparison.

5 Claims, 3 Drawing Sheets

DEVICE AND METHOD FOR MONITORING AND CONTROLLING LASER WAVELENGTH

FIELD OF THE INVENTION

The present invention relates to monitoring and controlling laser wavelength.

BACKGROUND OF THE INVENTION

Lasers have long been known in the art for a wide variety of uses. These sources of light are arranged to function at a certain predetermined wavelength. In some applications, it is unimportant whether the wavelength of the laser remains essentially constant over time. However, in other applications, such as optical telecommunications, and medical lasers, it is crucial that the preset wavelength be maintained throughout the use of the laser. This is necessary due to aging of the laser, as well as the in environmental effect of temperature, two of the major factors affecting laser wavelength.

A number of proposals have been made in the literature as to ways to monitor and control lasers. In particular, much research has been conducted in the area of telecommunications over optical fiber lines. The most common solution is to use an outside wavelength reference from, for example, a synchronized Etalon filter which provides a set of equally spaced references at the standardized wavelengths, or from a frequency stabilized master laser. However, these devices require additional expensive equipment as well as temperature control and stabilization of the Etalon or master laser. Thus, these devices rely on an external reference source to maintain the laser wavelength.

Another solution is to use a reference filter. Yet another suggestion is to lock the wavelength comb of a tunable DBR to a waveguide grating router to enable a laser to track and correct uncontrolled changes in a remotely located WDM device. Another is to use an arrrayed-waveguide grating. Yet another utilizes a narrow-band reflective fiber grating at a temperature sensor at the remote receiver. A further proposal includes a frequency control scheme where the frequency of each transmitter is referenced to a silica based optical frequency discriminator, which in addition is locked to an absolute reference frequency. It has also been suggested to use cascaded fibre Bragg gratings as channel allocators for unequally spaced channel multiplexing, and multiwavelength lasers can be successfully locked to the transmission dips produced from the cascade FBG's by using the dithering technique. These proposed devices are generally complicated mechanically and expensive, requiring a number of filters arranged with high accuracy.

Accordingly, there is a long felt need for a simple device for monitoring and controlling laser wavelength which is relatively simple to build and maintain, highly accurate, and which is substantially unaffected by temperature, and it would be very desirable to have such a device which does not rely on an external reference wavelength,

SUMMARY OF THE INVENTION

According to the present invention, there is provided a device for monitoring and controlling the wavelength of a semiconductor laser having an adjustable wavelength, the device including a wavelength filter including a medium-dense wavelength division demultiplexer (WDM) arranged to receive a portion of the laser power of the laser and divide it between two filter outputs, a photoreceiver arranged to measure the output power at each filter output, a processor coupled to the photoreceivers and arranged to compute the ratio of power at the two filter outputs, apparatus to compare the computed ratio with a predetermined reference ratio, and apparatus to adjust the wavelength of the laser in response to the comparison.

According to one embodiment of the invention, the WDM filter has an optical spectral range of about 40 nm around 1550 nm, and is centered at a wavelength within this range.

According to another embodiment of the invention, the apparatus for adjusting the wavelength includes a temperature controller associated with the laser, and means in said processor to activate said temperature controller until said computed ratio equals said predetermined reference ratio.

There is also provided in accordance with the present invention a method for monitoring and controlling the wavelength of a semiconductor laser, the method including the steps of:

(a) feeding a portion of the output laser power of the laser to a wavelength filter including a wavelength division demultiplexer (WDM) arranged to receive the laser output and divide it between two filter outputs:

(b) measuring the power at each of the two filter outputs;

(c) computing the ratio of the power at the filter outputs;

(d) comparing the computed ratio with a predetermined reference ratio;

(e) adjusting the wavelength of the laser in response to the comparison; and (f) repeating steps (b) through (e) until the computed ratio equals the predetermined reference ratio.

BRIEF DESCRIPTION OF THE DRAWINGS

The present invention will be further understood and appreciated from the following detailed description taken in conjunction with the drawings in which.

DETAILED DESCRIPTION OF THE INVENTION

The present invention relates to a device and method for monitoring and controlling the wavelength of a semiconductor laser. The invention is based on the use of wavelength filter including a medium-dense wavelength division demultiplexer (WDM), which takes an input wavelength and divides it between two filter outputs above and below the filter bandwidth center, or 0 point. In the past, such multiplexers have been used as demultiplexers for signals including a number of wavelengths, to divide the wavelengths into groups. The present invention is based on the fact that the ratio of the power at the two filter outputs is highly dependent upon the input wavelength, and utilizes this ratio in order to monitor and control the input wavelength coming from the laser. Thus, the present invention takes a single wavelength and divides its power between the two filter outputs.

It is a particular feature of the present invention that the ratio of outputs of the wavelength filter is substantially unaffected by temperature. (At present, the effect of changing temperature is on the order of 0.001 nm per °C. variance, which is negligible in the present context.) Thus, this WDM filter acts as its own reference, so no external reference is required for calibration. Furthermore, since this is a passive filter, there is very low cross-talk, and ratios can be measured with extremely high accuracy.

Figure 1:
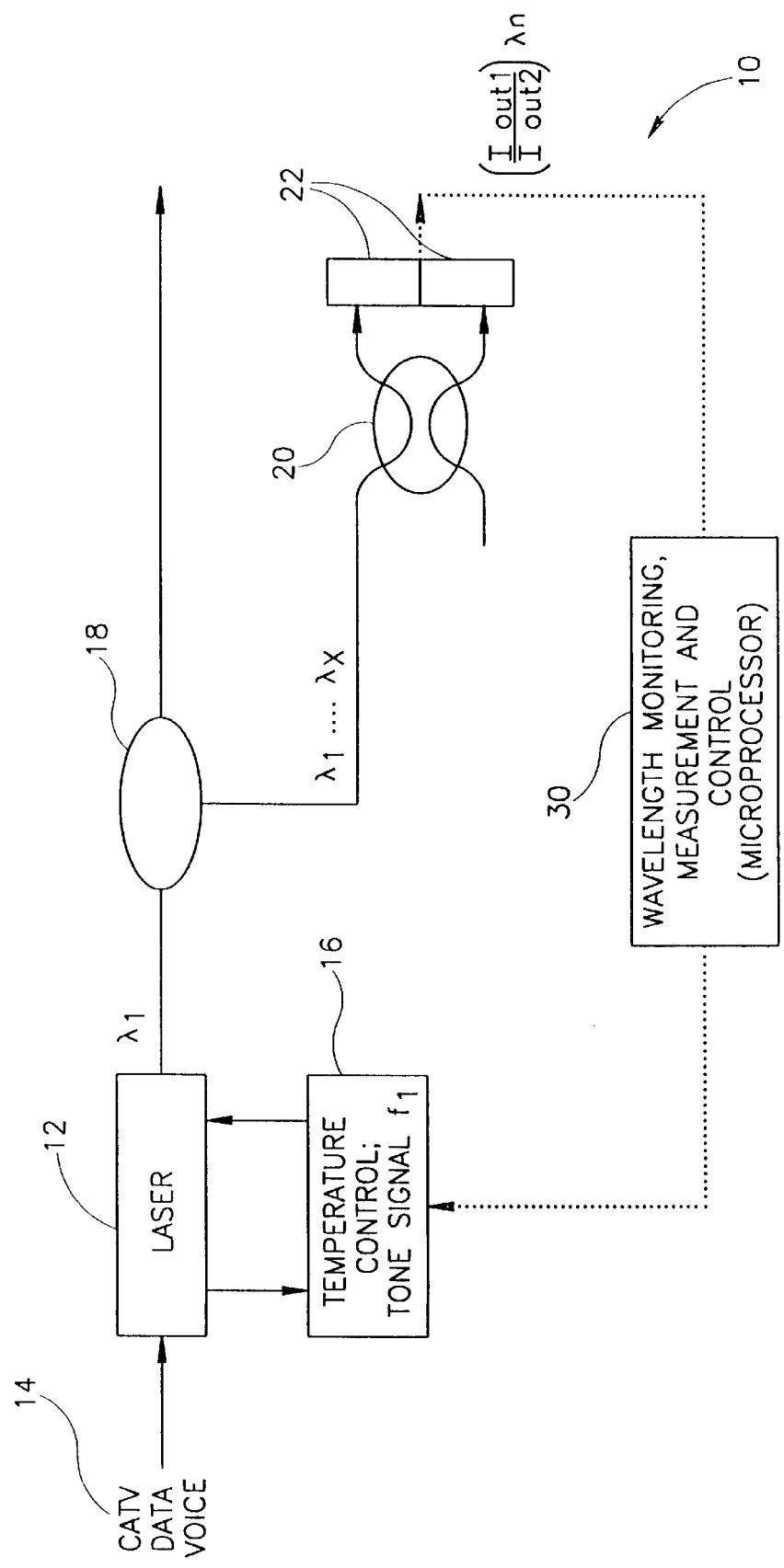
FIG. 1 is a schematic illustration of a device for monitoring and controlling the wavelength of a laser constructed and operative in accordance with one embodiment of the invention.

Referring now to FIG. 1, there is shown a schematic illustration of a device 10 for monitoring and controlling the wavelength of a laser 12 constructed and operative in accordance with one embodiment of the invention. Laser 12 is preferably a semiconductor laser. The semiconductor lasers currently used fall into two categories—fixed wavelength lasers, such as DFB (distribution feedback) lasers, which are wavelength selected for a particular channel and then tuned, as with temperature, to operate at a standardized wavelength, and tunable lasers, such as DBR (distributed Bragg reflection) lasers, whose frequency can be switched or tuned to any desired frequency and stabilized in the desired channel. Laser 12 can be any semiconductor laser whose wavelength can be adjusted, including a fixed wavelength cooling laser, such as DFB lasers, for example FU-655-PDF-2 of Mitsubishi Electric Corp. and LCS2210 of Hewlett-Packard, and tunable lasers, including DBR lasers, such as LD500 ODBR series of GEC Marconi.

A wavelength regulator 16 is associated with each laser 12 for adjusting the output wavelength. Wavelength regulator 16 can be a thermo electric cooler, for changing the wavelength by adjusting the temperature, or a fiber grating, or any other means for adjusting wavelength, as known.

Laser 12 can act as an optical source for optical fiber telecommunications, or it can communicate data received from an outside source 14, such as cable TV transmission data, which is transferred onwards in optical form through atmosphere telecommunications, or as a pure light source, as in medical applications, for example.

The output laser power of laser 12 passes through a splitter 18, such as a 90/10 coupler, which passes 90% (or other selected percentage) of the laser power to the desired receiver, and 10% (or other remaining percentage) to the device 10 of the present invention. Device 10 includes a wavelength filter 20 and a processor 30, which can be a microprocessor. Wavelength filter 20 includes a wavelength division demultiplexer, such as the Single Mode WDM manufactured by Gould Fiber Optics, USA, or the Narrow Band Filter WDM manufactured by DiCon Fiber Optics, Inc., USA, whose center is selected in accordance with the wavelength of the laser to be monitored. According to one embodiment of the invention, particularly useful for optical fiber telecommunications, the wavelength filter has a spectral range of about 40 nm around 1550 nm, and is centered at a wavelength within this range. It will be appreciated that since it is the ratio of the filter outputs (and not their absolute values) that is of interest, the precise center location is not important, so long as the filter is operative throughout the entire wavelength range of interest. Alternatively, the wavelength filter can be operative in the 1300 nm range, when lasers in this wavelength range are used.

Figure 2:
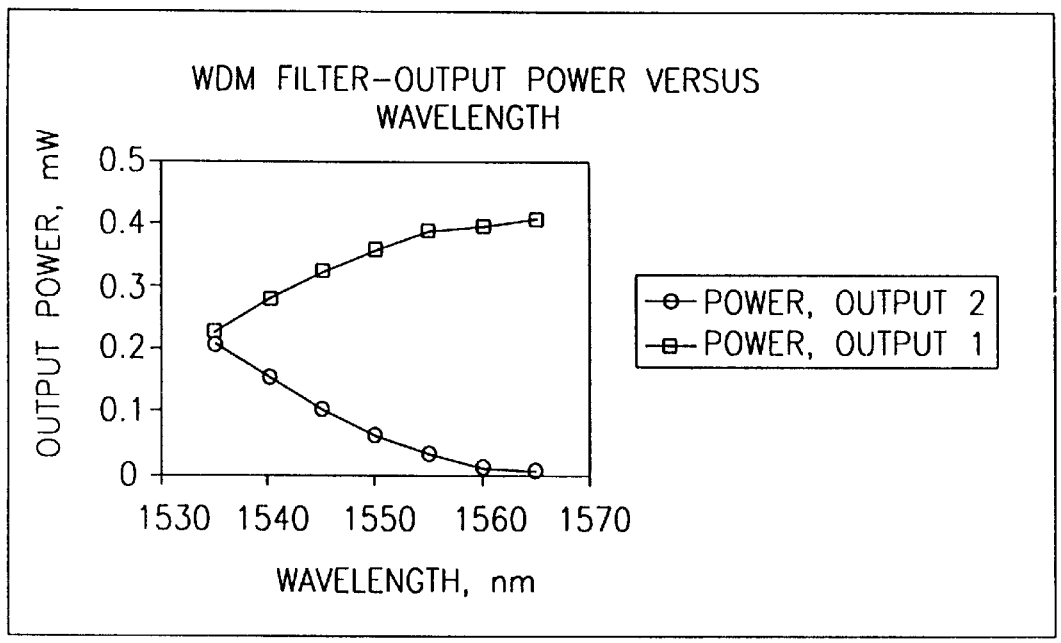
FIG. 2 is a graphic illustration of the output power versus wavelength of a WDM wavelength filter useful in the present invention.
Figure 3:
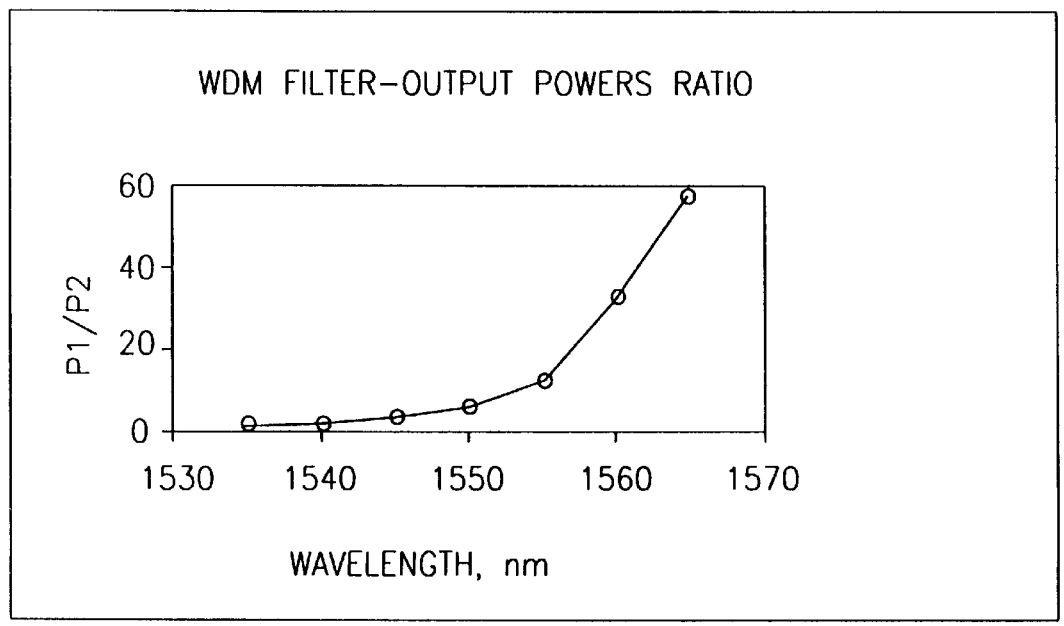
FIG. 3 is a graph illustrating output power ratio versus wavelength for the wavelength filter of FIG. 2.

Referring now to FIG. 2, there is shown a graphic illustration of the output power, in milliwatts (mW), versus wavelength in nanometers of a wavelength filter useful in one embodiment of the present invention. As can be seen, any input wavelength is divided by the wavelength filter into a portion above the center of the filter's bandwidth and a portion below the center of the filter's bandwidth. The ratio of output power above (P1) to output power below (P2) is constant for a given input wavelength, For example, in the filter illustrated in FIG. 2, the ratio for an input wavelength of 1550 nm is 7. FIG. 3 is a graph illustrating output power ratio P1/P2 versus wavelength for the wavelength filter of FIG. 2.

Figure 4:
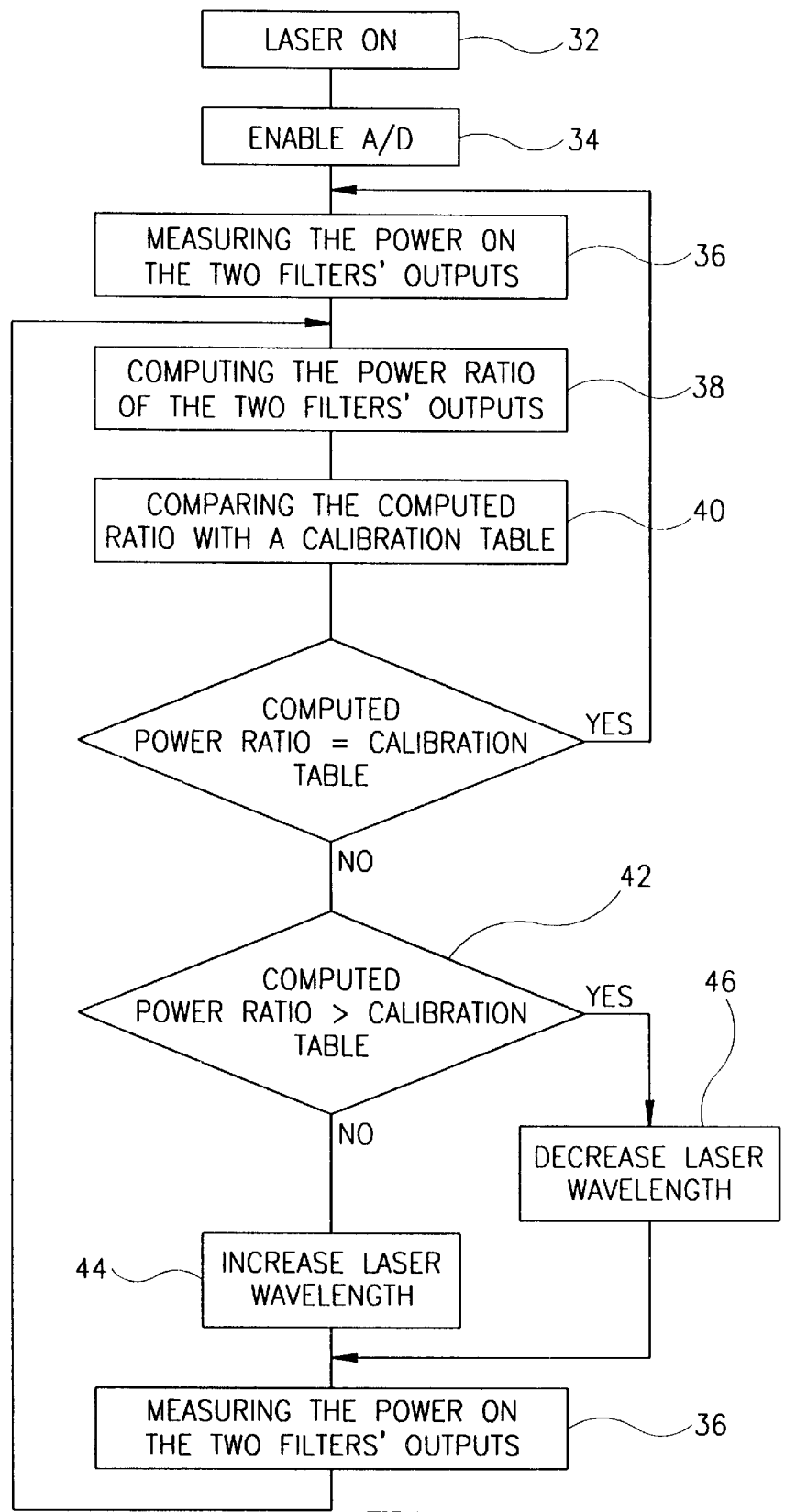
FIG. 4 is a flow chart illustrating the operation of a controlling processor in the device of the present invention.

Controlling processor 30 is coupled to the output of wavelength filter 20 through a pair of photoreceivers 22, which measure the laser power at each of the two filter outputs. Photoreceivers 22 are coupled through an Analog to Digital Converter (A/D) 34 to processor 30. Processor 30 is also coupled to wavelength regulator 16 of laser 12. FIG. 4 is a flow chart illustrating the operation of controlling processor 30. Processor 30 turns on laser 12 (reference 32) and enables A/D converter 34. Processor 30 then receives the measurements of the output power signals from photoreceivers 22 (reference 36) and computes 38 the ratio thereof. It includes a comparator which compares 40 the computed ratio with the predetermined reference ratio in a calibration table stored in the processor memory. If the ratio is not equal to the reference ratio, processor 30 sends 42 a signal to wavelength regulator 16 to raise 44 or lower 46 the wavelength of laser 12. Since laser 12 is continuously emitting light, controlling processor 30 continues to compute the output power ratio and compare it to the reference ratio and to adjust the laser until the two ratios are substantially equal (steps 36 to 46).

It will be appreciated that the invention is not limited to what has been described hereinabove merely by way of example. Rather, the invention is limited solely by the claims which follow.

What is claimed is:

1. A device for monitoring and controlling the wavelength of a semiconductor laser having an associated wavelength regulator, the device comprising:
   (a) a wavelength filter including a medium-dense wavelength division demultiplexer (WDM) arranged to receive a portion of the laser output power of the laser and divide it between two filter outputs;
   (b) a photoreceiver arranged to measure the power at each said filter output;
   (c) a processor arranged to compute the ratio of power at said two filter outputs;
   (d) means for comparing said computed ratio with a predetermined reference ratio; and
   (e) means for adjusting the wavelength of the laser in response to said comparison.

2. The device of claim 1, wherein said WDM filter has a spectral range of about 40 nm around 1550 nm, and is centered at a wavelength within this range.

3. The device of claim 1, wherein said means for adjusting the wavelength includes a temperature controller associated with the laser, and means in said processor to activate said temperature controller until said computed ratio substantially equals said predetermined reference ratio.

4. The device of claim 2, wherein said means for adjusting the wavelength includes a temperature controller associated with the laser, and means in said processor to activate said temperature controller until said computed ratio substantially equals said predetermined reference ratio.

5. A method for monitoring and controlling the wavelength of a semiconductor laser whose wavelength is adjustable, the method including the steps of:

(a) feeding a portion of the laser output power of the laser to a wavelength filter including a wavelength division demultiplexer (WDM) arranged to receive the laser output power and divide it between two filter outputs;

(b) measuring the power at each filter output;

(c) computing the ratio of said measured power at said two filter outputs;

(d) comparing said computed ratio with a predetermined reference ratio;

(e) adjusting the wavelength of the laser in response to said comparison; and (f) repeating steps (b) through (e) until said computed ratio substantially equals said predetermined reference ratio.

* * * * *